United States Patent
Chen et al.

(10) Patent No.: US 7,399,686 B2
(45) Date of Patent: *Jul. 15, 2008

(54) METHOD AND APPARATUS FOR MAKING COPLANAR DIELECTRICALLY-ISOLATED REGIONS OF DIFFERENT SEMICONDUCTOR MATERIALS ON A SUBSTRATE

(75) Inventors: Howard Hao Chen, Yorktown Heights, NY (US); Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 367 days.

This patent is subject to a terminal disclaimer.

(21) Appl. No.: 11/218,198

(22) Filed: Sep. 1, 2005

(65) Prior Publication Data

US 2007/0048975 A1  Mar. 1, 2007

(51) Int. Cl.
*H01L 21/36* (2006.01)
*H01L 21/20* (2006.01)

(52) U.S. Cl. .............................. 438/478; 257/E21.103; 257/E21.115; 257/E21.461; 257/E21.562; 257/E27.137

(58) Field of Classification Search ............ 257/E21.09, 257/E21.103, E21.115, E21.461, E21.562, 257/E27.137
See application file for complete search history.

(56) References Cited

U.S. PATENT DOCUMENTS

| 4,169,000 | A | 9/1979 | Riseman |
| 5,480,832 | A | 1/1996 | Miura et al. |
| 6,635,534 | B2 | 10/2003 | Madison |
| 2002/0006715 | A1 | 1/2002 | Chhagan et al. |
| 2005/0030780 | A1 | 2/2005 | Dppe et al. |

*Primary Examiner*—Asok K Sarkar
(74) *Attorney, Agent, or Firm*—F. Chau & Associates, LLC

(57) ABSTRACT

A semiconductor processing method includes providing a substrate, forming a plurality of semiconductor layers in the substrate, each of the semiconductor layers being distinct and selected from different groups of semiconductor element types, the semiconductor layers comprising first, second, and third semiconductor layers. The method further includes forming a nitride cap layer on the second semiconductor layer prior to forming the third semiconductor layer. Semiconductor structure formed by the above method is also described.

20 Claims, 5 Drawing Sheets

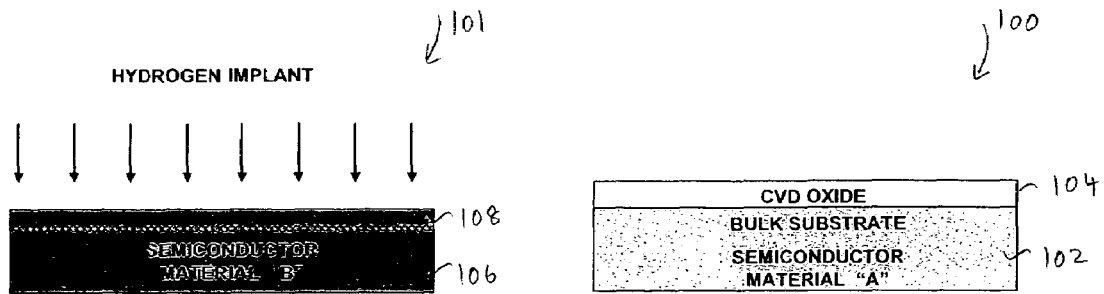
Figure 1. Preparation of two substrates with different semiconducting materials.
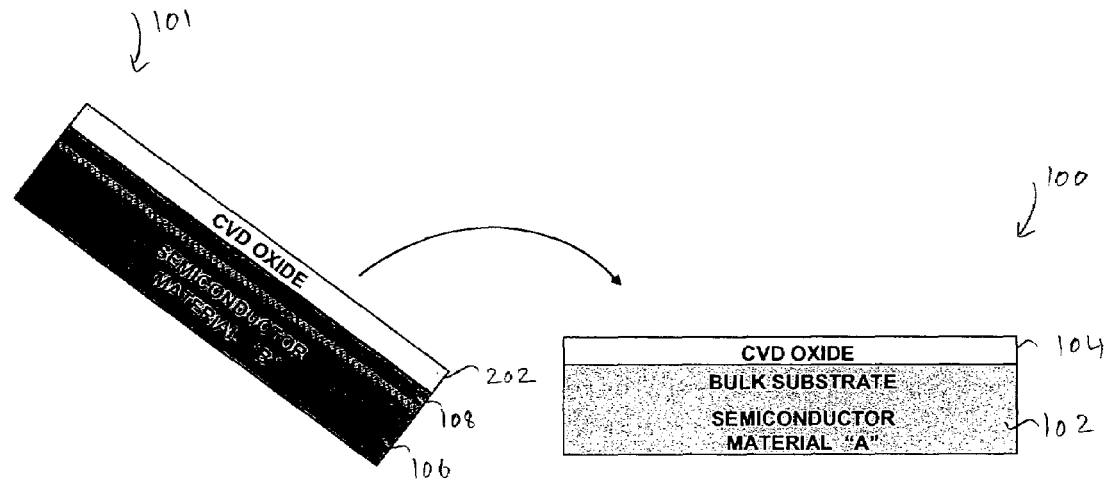
Figure 2. Forming CVD oxide on the second substrate.
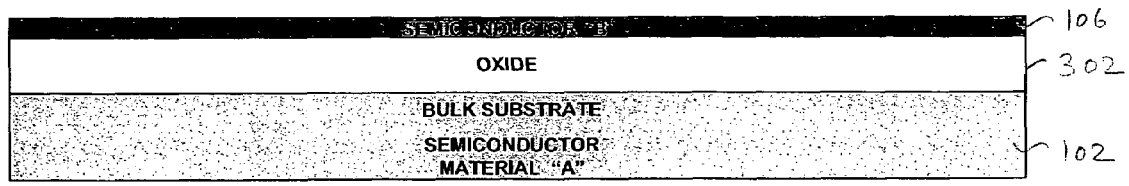
Figure 3. Bonding the oxide layers of two substrates.

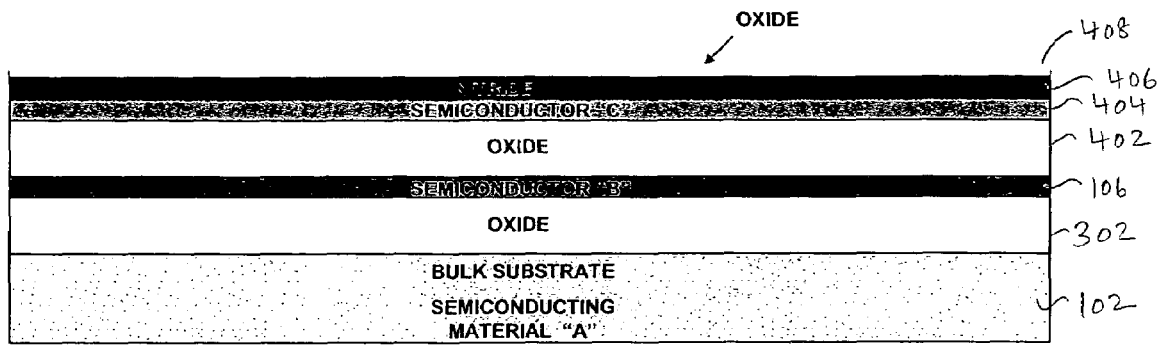
Figure 4. Bonding a third substrate of semiconducting material "C".
Figure 5. Photoresist patterning and anisotropic etching.

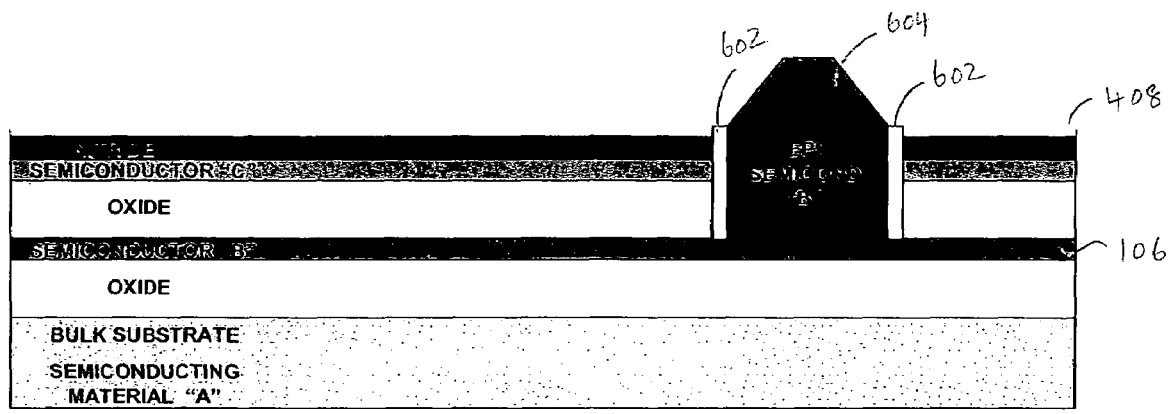
Figure 6. Selective epitaxial growth of semiconducting material "B".
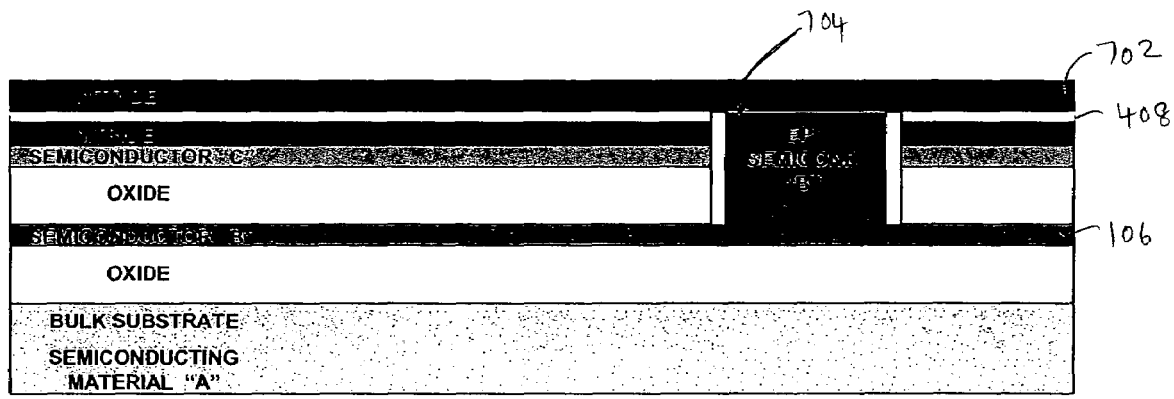
Figure 7. Top surface planarization and nitride deposition.

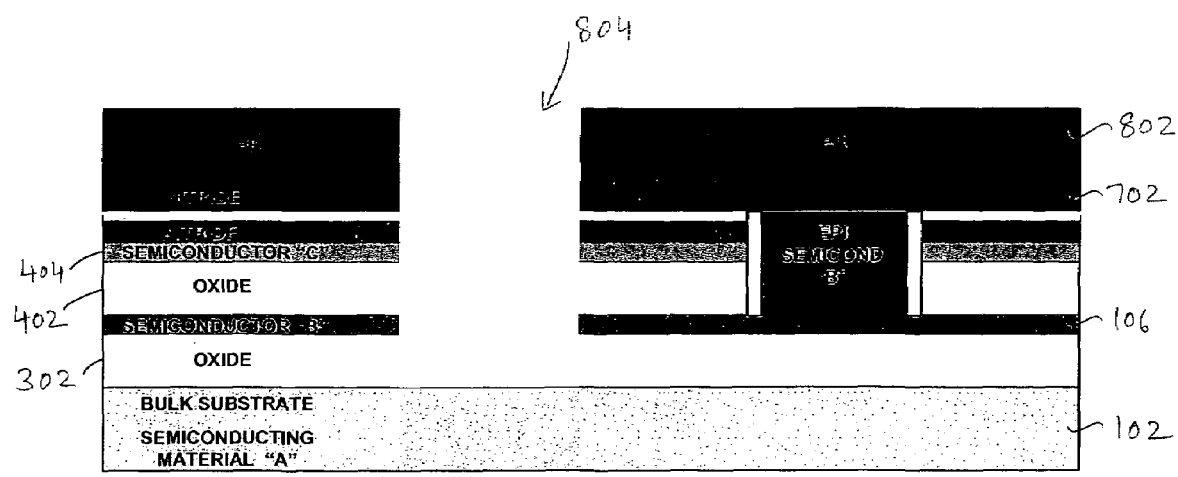
Figure 8. Photoresist patterning and anisotropic etching.
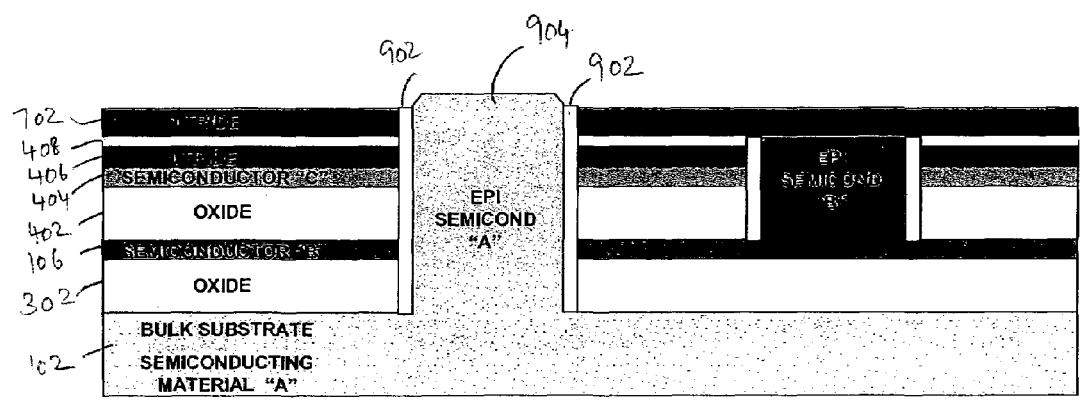
Figure 9. Selective epitaxial growth of semiconducting material "A".

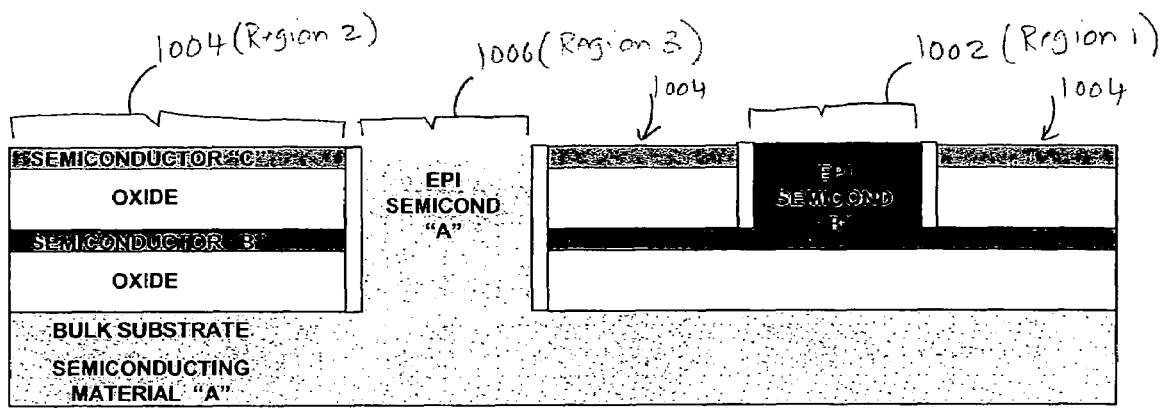
Figure 10. Final polishing and planarization.

METHOD AND APPARATUS FOR MAKING COPLANAR DIELECTRICALLY-ISOLATED REGIONS OF DIFFERENT SEMICONDUCTOR MATERIALS ON A SUBSTRATE

BACKGROUND OF THE INVENTION

1. Field of the Invention

The invention pertains to semiconductor processing methods and semiconductor constructions. In particular aspects, the invention pertains to a method and apparatus to integrate and fabricate coplanar dielectrically isolated regions of different semiconductor materials on a hybrid monolithic substrate.

2. Description of Related Art

Semiconductor devices fabricated on silicon (group IV) substrates are abundantly employed in high-volume microelectronics where high-density, high-performance, and low-power consumption are simultaneously desired. CMOS, bipolar, and BICMOS technologies fabricated on either bulk silicon or silicon on insulator (SOI) substrates are commonly used in microprocessor, memory, and analog electronics applications.

In addition to Silicon, there is a need for other types of group IV semiconductors such as Ge, SiGe and SiC for certain niche applications. For example, Germanium offers narrower bandgap and higher mobility than silicon. Silicon carbide is employed in products required to operate in harsh (e.g., hot) environments. However, group IV semiconductor devices have not been widely used for optoelectronics due to their indirect band gap structure which can result in low photo-emission efficiency.

Optoelectronic devices that are commonly used include III-V and II-VI compound semiconductor materials such as GaAs, InP, InGaP, InAs, AlGaAs, GaN, GaInAs, and AlGaSb. These compound semiconductor materials possess direct band gap properties and high photo-emission efficiency. Further, electronic properties of compound semiconductor materials make them ideal candidates for optoelectronics products such as LEDs, VCELs, photovoltaic devices, as well as high performance microwave devices such as PIN diodes, and heterojunction bipolar transistors (HBTs).

Designers, however, face persistent problems in integrating electronic and optoelectronic devices from multiple types of semiconductor materials into a single compact, high-performance and cost effective package.

In one approach to solve the above-noted problem, both silicon-based and compound semiconductor based optoelectronic integrated circuit chips are combined into a single package. The individual chips are interconnected by wiring, and optical waveguides formed on a common insulating or semi-insulating substrate are disclosed in U.S. Pat. No. 5,611,008, the entire contents of which are incorporated herein by reference.

The above-noted approach often suffers from performance penalties due to relatively long interconnections (e.g., on-chip interconnections) among the various types of integrated-circuit chips. Further, alignment of lasers to on-substrate fiberoptics can be a challenge. Other drawbacks include severe density penalty as scalability of interconnections on the common substrate falls far short of what can be achieved on individual IC chips. In addition to the above, the cost of manufacturing multi-chip substrates is high relative to the cost of manufacture single IC chips.

In another approach, a layer of mono-crystalline compound semiconductor (e.g. GaAs) is epitaxially grown directly on a silicon substrate. No intervening insulating layer exists between the silicon substrate and the grown layer as illustrated in U.S. Pat. No. 5,081,062, the entire contents of which are incorporated herein by reference. The resulting structure of this approach can complicate the process of isolating silicon electronics from compound semiconductor regions. Furthermore, regions of different semiconductor material formed using this approach are not coplanar, thereby resulting in depth of focus and other processing issues.

Another solution to the above-noted problem epitaxially grows a plurality of material layers including intervening strain relieving buffer and transition layers on a group IV semiconductor (e.g. Si) substrate having trenches as in U.S. Pat. No. 6,673,667, the entire contents of which are incorporated herein by reference. A monocrystalline III-V compound semiconductor (e.g. GaAs, AlGaAs) is then epitaxially grown over the buffer layers. Although, the patterned template layer is used to define the pattern of the top compound semiconductor layer, no substantial vertical isolation is achieved.

Therefore, there is a need to overcome the above-noted problems.

SUMMARY OF THE INVENTION

Various embodiments of the invention disclose a monolithic substrate having a plurality of coplanar regions of different semiconducting material, wherein each of the coplanar regions is isolated by dielectric material.

In one aspect, a semiconductor processing method includes providing a substrate, forming a plurality of semiconductor layers in the substrate, each of the semiconductor layers being distinct and selected from different groups of semiconductor element types, the semiconductor layers comprising first, second, and third semiconductor layers. The method further includes forming a nitride cap layer on the second semiconductor layer prior to forming the third semiconductor layer.

In another aspect, a semiconductor processing method includes providing a substrate, forming a plurality of semiconductor layers in the substrate, each of the semiconductor layers being selected from different groups of semiconductor element types. The method further includes forming a nitride cap layer over a previously formed semiconductor layer, from among the plurality of the semiconductor layers, prior to growth of another semiconductor layer over the previously formed semiconductor layer.

In a further aspect, a semiconductor construction includes a semiconductor substrate, a plurality of semiconductor layers provided in the semiconductor substrate, each of the semiconductor layers being selected from different groups of semiconductor element types, a plurality of semiconductor regions formed from the plurality of semiconductor layers. A nitride cap layer formed over a previously formed semiconductor layer, from among the plurality of the semiconductor layers, prior to growth of another semiconductor layer over the previously formed semiconductor layer, wherein the plurality of semiconductor regions have coplanar top surfaces.

BRIEF DESCRIPTION OF THE DRAWINGS

Preferred embodiments of the invention are described below with reference to the following accompanying drawings.

FIG. 1 is a diagrammatic, cross-sectional view of two different fragments of semiconductor wafers at a preliminary processing step where one of the semiconductor wafers is subjected to a shallow hydrogen implant in accordance with an embodiment of the invention.

FIG. 2 is a view of the FIG. 1 fragment shown at a processing step subsequent to that of FIG. 1.

FIG. 3 is a view of the FIG. 2 fragment shown at a processing step subsequent to that of FIG. 2 wherein one of the semiconductor substrates is flipped and placed in contact with another semiconductor substrate.

FIG. 4 is a view of the FIG. 3 fragment shown at a processing step subsequent to that of FIG. 3.

FIG. 5 is a view of the FIG. 4 fragment shown at a processing step subsequent to that of FIG. 4.

FIG. 6 is a view of the FIG. 5 fragment shown at a processing step subsequent to that of FIG. 5.

FIG. 7 is a view of the FIG. 6 fragment shown at a processing step subsequent to that of FIG. 6.

FIG. 8 is a view of the FIG. 7 fragment shown at a processing step subsequent to that of FIG. 7.

FIG. 9 is a view of the FIG. 8 fragment shown at a processing step subsequent to that of FIG. 8.

FIG. 10 is a view of the FIG. 9 fragment shown at a processing step subsequent to that of FIG. 9.

DETAILED DESCRIPTION OF THE PREFERRED EMBODIMENTS

The invention encompasses methods to integrate and fabricate coplanar dielectrically-isolated regions of different semiconductor materials on a hybrid monolithic substrate. A method of the present invention is described with references to FIGS. 1-10. In referring to FIGS. 1-10, similar numbering will be used to identify similar elements, where appropriate.

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In exemplary constructions, a substrate can comprise various conductive, semiconductive, and insulative semiconductor device components (not shown), in addition to monocrystalline silicon.

Referring initially to FIG. 1, two different fragments of semiconductor constructions 100 and 101 are illustrated. Construction 100 includes a substrate 102 comprising a semiconductor material of a first type (e.g., first element type). Construction 101 includes a substrate 106 comprising a semiconductor material of a second type (e.g., second element type). In some embodiments, the semiconductor material of the first type is referred to as semiconductor material "A" and the semiconductor material of the second type is referred to as "semiconductor material "B."

The semiconductor material for the substrate 102 can be selected from group IV of the periodic table of elements. For example, the substrate 102 can comprise silicon. The semiconductor material for the substrate 106 and semiconductor material 404 (FIG. 4) can comprise a compound semiconductor selected from groups III-V or II-VI of the periodic table of elements. For example, the semiconductor material for the substrate 106 can comprise GaAs, InP, or other heterojunction materials like AlGaAs, AlInP, etc. Dissimilar semiconductor element types are defined as semiconductor materials selected from different groups of periodic table of elements. For example, if semiconductor material 102 is a Group IV material, then semiconductor material 106 can be material from group II-VI, and semiconductor material 404 can be material from group III-V of the periodic table of elements.

A layer of oxide 104 is grown over the substrate 102. The oxide layer 104 can be formed by any one or combination of well known methods such as chemical vapor deposition (CVD) or thermal oxidation. Other suitable dielectric materials can also be used for the oxide layer 104. In one example, the thickness of the oxide layer 104 preferably ranges from 5 nm to 100 nm. A shallow implant of hydrogen, or other species configured to induce lattice damage over a narrow depth, is made into the substrate 106.

The use of hydrogen implant for inducing a separation boundary between a thin upper region 108 and the substrate 106 is known and therefore will not be explained in detail herein. The temperature at which the shallow hydrogen implant is performed is preferably maintained below 500° C. in order to prevent formation of microbubbles and premature separation.

FIG. 2 is a view of the FIG. 1 fragment shown at a processing step subsequent to that of FIG. 1. An oxide layer 202 is formed on the surface of the substrate 106. The thickness of the oxide layer 202 preferably ranges from 5 nm to 100 nm.

The construction 101 comprising the substrate 106 is then flipped and placed in contact with the construction 100 such that the oxide layer 104 is contact with the oxide layer 202. The constructions 100 and 101 now form an integrated semiconductor construction 300 (FIG. 3). An anneal is then performed to bond the oxide layers 104, 202 to each other to form an single oxide layer 302 as illustrated in FIG. 3. The anneal also separates the semiconductor substrate 106 comprising semiconductor material of the second type from the remainder of the semiconductor construction 300 comprising the oxide layer 302 and the substrate 102. The temperature of the anneal preferably ranges from 800° C. to 1100° C. The oxide layer 302 comprises borophosphosilicate glass (BPSG). The composition of the oxide layers 104, 202 can be tailored to facilitate bonding and reflow at relatively low anneal temperatures in order to form the oxide layer 302. The surface of semiconducting material "B" also referred to as substrate 106 is polished. For example, CMP polishing can be used.

In one embodiment, a thin (e.g., 1 nm-10 nm) nitride barrier layer (not shown) may be deposited on the surface of each of the constructions 100 and 101 prior to CVD oxide deposition. One purpose of the nitride barrier layer is to inhibit diffusion of boron or phosphorus from the BPSG comprised in the oxide layers (e.g., 104, 202) into the respective semiconductor materials (e.g., 102, 106).

Referring to FIG. 4, another oxide layer 402 (FIG. 4) is then formed on the surface of semiconducting material 106. A layer of semiconducting material 404 (e.g., semiconductor material C) is formed over the oxide layer 402. Forming of the semiconducting material 404 over the semiconducting substrate 106 is performed similar to the process used for forming the semiconductor construction 101 over the semiconductor construction 100 as illustrated in FIG. 2 and described above. The semiconducting layer 404 is then subjected to a bonding and separation process similar to the bonding of the constructions 100 and 101. The surface of the semiconducting material 404 is polished.

Continuing to refer to FIG. 4, a layer of nitride 406 (e.g., 10 nm-100 nm) followed by a layer of oxide 408 (e.g., 2 nm-20 nm) are deposited on the surface of semiconducting material 404. The nitride layer 406 and the oxide layer 408 will subsequently serve as polish stop/marker layers for the planarization and polishing of semiconducting regions in a final structure as illustrated in FIG. 10.

FIG. 5 is a view of the FIG. 4 fragment shown at a processing step subsequent to that of FIG. 4. A layer of photoresist 502 is applied and patterned over the oxide layer 408. An anisotropic etch is then performed through the upper dielectric layers (e.g., 408, 406), semiconducting material 404 (e.g., semiconductor C), and through the oxide layer 402 located between semiconducting material layers 404 and 106 to form a first opening 504. Etching of the oxide layer 402 is RIE selective to semiconducting material 106 (e.g., semiconducting material B). The opening 504 can be in the form of a via extending to an upper surface of the semiconducting material 106 (e.g., semiconducting material B), and the opening 504 can be in the shape of a slot.

FIG. 6 is a view of the FIG. 5 fragment shown at a processing step subsequent to that of FIG. 5 wherein the photoresist layer 502 is stripped, and a layer of CVD oxide is deposited in the opening 504 and etched (e.g., RIE etching) to form oxide spacers 602 on the sidewalls of the opening 504. Then, the exposed surface of semiconducting material 106 serves as a seed layer for the selective epitaxial growth of semiconducting material 106 in the opening 504. The epitaxially grown semiconductor material in opening 504 is identified using reference numeral 604.

Referring to FIG. 7, the semiconducting material 106 (e.g., seed layer 106) that is epitaxially grown in the opening 504 is planarized substantially to the top surface of the upper oxide layer 408. A CVD nitride layer 702 (e.g., 10 nm-100 nm thick) is then deposited over the oxide layer 408 and the top surface 704 of the epitaxially grown semiconductor material 106 in order to form a nitride cap layer.

Such capping allows a different type of semiconductor material to be grown (as illustrated in FIG. 9) without disturbing the surface of semiconductor material 604. It will be appreciated that semiconducting materials used for layers 106 and 604 are same.

Once the surface 704 of the semiconductor material 106 is capped, epitaxial growth of the semiconductive material 102 is performed as will be illustrated with respect to FIGS. 8-9. As noted above, reference numeral 604 is used merely to identify the epitaxially grown portion of the semiconductor material 106. Such capping with the nitride layer (e.g., nitride cap layer) prevents nucleation of material of the semiconductor material 102 (e.g., semiconductor material A) on an exposed surface (e.g., epitaxial region 604 and surface 704) of the semiconductor material 106 (e.g., semiconductor material B), thereby preventing downward propagation of crystal defects into the semiconductor material 106.

Referring to FIG. 8, a new layer of photoresist 802 is applied and patterned over the nitride layer 702. Recesses are anisotropically etched into the exposed regions of the substrate to form a second opening 804. Etching is performed through the upper dielectric layers, semiconducting material layer 404 (e.g., semiconducting material C), its back oxide layer 402, semiconducting layer 106 (e.g., semiconducting layer B) and through the lower CVD oxide layer 302. The RIE of the lower CVD oxide 302 is selective to the semiconducting material layer 102 (e.g., semiconducting material A).

Referring to FIG. 9, the photoresist layer 802 is stripped, and a layer of CVD oxide is deposited in the opening 804 and etched (e.g., RIE etched) to form oxide spacers 902 on the sidewalls of the opening 804. Then, the exposed surface of semiconducting substrate 102 serves as a seed layer for the selective epitaxial growth of semiconducting material 102. The epitaxially grown semiconductor material in opening 804 is identified using reference numeral 904.

The upper surface of the semiconductor construction shown in FIG. 9 is then planarized and polished. In the course of polishing, the upper nitride layer 702 is first removed. Then, the polishing operation continues through the thin oxide layer 408 over the lower nitride layer 406. When polishing has gone through the oxide layer 408, the signature of the lower nitride layer 406 is detected, and the polish rate is reduced such that the nitride layer 406 is substantially removed and overpolish of semiconducting material 404 (e.g., semiconducting material C) is avoided. Any remaining nitride is etched away.

FIG. 10 is a view of the structure after final polishing and planarization performed on the fragment shown in FIG. 9. As it is apparent, the final structure of FIG. 10 illustrates a first semiconductor region 1002, a second semiconductor region 1004, and a third semiconductor region 1006. The first, second, and third semiconductor regions 1002, 1004, and 1006 are coplanar and electrically insulated by laterally adjacent insulator regions 602, 902, respectively. In one embodiment, the first and second semiconductor regions 1002, 1004 are protected while processing the third semiconductor region 1006. It will be appreciated that the first, second, and third regions are merely exemplary. More or less number of semiconductor regions can be created using the methodology described in FIGS. 1-9.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
   providing a substrate;
   forming a plurality of semiconductor layers in the substrate, each of the semiconductor layers being distinct and selected from different groups of semiconductor element types, the semiconductor layers comprising first, second, and third semiconductor layers; and
   forming a nitride cap layer on the second semiconductor layer prior to forming the third semiconductor layer.

2. The method of claim 1, wherein the first, second, and third semiconductor layers comprise materials of dissimilar semiconductor element types.

3. The method of claim 1, wherein the nitride cap layer facilitates growth of the third semiconductor layer without disturbing a surface region of the second semiconductor layer.

4. The method of claim 1, further comprising:
   providing an insulative layer for electrically insulating each of the semiconductor layers from the other semiconductor layers.

5. The method of claim 4, wherein the insulative layer comprises borophosphosilicate glass.

6. The method of claim 1, wherein the different groups of semiconductor element types comprises semiconductor materials from group IV, groups III-V, or groups II-VI of the periodic table of elements.

7. The method of claim 1, wherein the nitride cap layer prevents nucleation of material of the third semiconductor layer on an exposed surface of the second semiconductor layer, thereby preventing downward propagation of crystal defects into the second semiconductor layer.

8. The method of claim 1, wherein the substrate comprises a monolithic substrate.

9. A semiconductor processing method, comprising:
providing a substrate;
forming a plurality of semiconductor layers in the substrate, each of the semiconductor layers being selected from different groups of semiconductor element types; and
forming a nitride cap layer over a previously formed semiconductor layer, from among the plurality of the semiconductor layers, prior to growth of another semiconductor layer over the previously formed semiconductor layer.

10. The method of claim 9, wherein the plurality of semiconductor layers comprise first, second, and third semiconductor layers.

11. The method of claim 9, wherein a plurality of semiconductor regions are formed in the substrate by the forming of the plurality of the semiconductor layers, the plurality of semiconductor regions comprising first, second, and third semiconductor regions.

12. The method of claim 11, wherein the first, second, and third semiconductor regions have coplanar top surfaces.

13. The method of claim 11, further comprising:
providing an insulative layer for electrically insulating each of the semiconductor regions from adjacent semiconductor regions.

14. The method of claim 13, wherein the insulative layer comprises borophosphosilicate glass.

15. The method of claim 9, wherein the nitride cap layer facilitates growth of the third semiconductor layer without disturbing a surface region of the second semiconductor layer.

16. The method of claim 9, wherein the different groups of semiconductor element types comprises semiconductor materials selected from group IV, groups III-V, or groups II-VI of the periodic table of elements.

17. The method of claim 9, wherein the nitride cap layer prevents nucleation of material of the third semiconductor layer on an exposed surface of the second semiconductor layer, thereby preventing downward propagation of crystal defects into the second semiconductor layer.

18. A semiconductor construction, comprising:
a semiconductor substrate;
a plurality of semiconductor layers provided in the semiconductor substrate, each of the semiconductor layers being selected from different groups of semiconductor element types;
a plurality of semiconductor regions formed from the plurality of semiconductor layers;
a nitride cap layer formed over a previously formed semiconductor layer, from among the plurality of the semiconductor layers, prior to growth of another semiconductor layer over the previously formed semiconductor layer; and
wherein the plurality of semiconductor regions have coplanar top surfaces.

19. The semiconductor construction of claim 18, wherein the different group of semiconductor element types comprises semiconductor materials selected from group IV, groups III-V, or group II-VI of the periodic table of elements.

20. The semiconductor construction of claim 18, wherein the nitride cap layer prevents nucleation of material of the third semiconductor layer on an exposed surface of the second semiconductor layer, thereby preventing downward propagation of crystal defects into the second semiconductor layer.

* * * * *